(12) United States Patent
Wu

(10) Patent No.: US 9,148,102 B2
(45) Date of Patent: Sep. 29, 2015

(54) CONTACTLESS VOLUME CONTROL DEVICE WITH ADJUSTABLE GAIN AND MULTI-OUTPUT

(71) Applicant: Ruh-Hua Wu, Longtan Township, Taoyuan County (TW)

(72) Inventor: Ruh-Hua Wu, Longtan Township, Taoyuan County (TW)

(73) Assignee: CHUNG SHAN INSTITUTE OF SCIENCE AND TECHNOLOGY, ARMAMENTS BUREAU, M. N.D., Taoyuan County (TW)

( * ) Notice: Subject to any disclaimer, the term of this patent is extended or adjusted under 35 U.S.C. 154(b) by 342 days.

(21) Appl. No.: 13/707,576

(22) Filed: Dec. 6, 2012

(65) Prior Publication Data

US 2014/0161284 A1 Jun. 12, 2014

(51) Int. Cl.
*H03G 3/00* (2006.01)
*H03G 3/04* (2006.01)
*H03G 3/32* (2006.01)
*H03G 1/00* (2006.01)

(52) U.S. Cl.
CPC ............... *H03G 3/04* (2013.01); *H03G 3/001* (2013.01); *H03G 1/0088* (2013.01); *H03G 3/32* (2013.01)

(58) Field of Classification Search
None
See application file for complete search history.

(56) References Cited

U.S. PATENT DOCUMENTS

| 6,596,955 B2* | 7/2003 | Eves et al. ............... 200/550 |
| 2006/0164280 A1* | 7/2006 | Nehls et al. ............. 341/176 |
| 2014/0161285 A1* | 6/2014 | Oh et al. ................. 381/107 |

* cited by examiner

Primary Examiner — Andrew L Sniezek
(74) Attorney, Agent, or Firm — Chun-Ming Shih

(57) ABSTRACT

A contactless volume control device with adjustable gain and multi-output is configured as a contactless structure with a magnetic slider and a plurality of magnet sensors. The magnetic field of the magnetic slider is sensed by the plurality of magnet sensors to generate a plurality of sensed signals, which allows an output module to provide a data table to show the position of the magnetic slider and the corresponding output voltage thereof according to the sensed signals. Furthermore, the output module is capable of storing multiple variable data to produce different outputs so as to achieve the objective of gain adjusting. Additionally, a processing unit built in the output module has a plurality of output ends so as to output multiple signals. And the magnetic slider and the plurality of magnet sensors have advantages of simple structure, easy manufacture and low cost.

4 Claims, 4 Drawing Sheets

CONTACTLESS VOLUME CONTROL DEVICE WITH ADJUSTABLE GAIN AND MULTI-OUTPUT

BACKGROUND OF THE INVENTION

1. Field of the Invention

This invention is related to a contactless volume control device with adjustable gain and multi-output, and more particular to an output voltage modulation via a position sensing device.

2. Description of Related Art

Ordinary volume control devices have the advantages of simple structure and high reliability, whose output voltages are mostly controlled by a contact structure consisting of a conductive carbon film and an electric brush. But the output (location vs. output voltage relationship) applied to volume adjustment must be a logarithmic type so as to comply with the feelings of the human auditory, thus this kind of contact causes high manufacturing cost and the usage value thereof relatively low. The contact type has a certain service life, and if the contact interface is polluted, the voltage output will be affected and the service life will be shortened. Further, even a contactless type consisting of variable capacitors is also able to solve the above mentioned output problem, the manufacturing cost of this type is still high.

In fact, a common volume control device is a position sensing device. Currently the contactless position sensing technologies and patents mainly use the combination design of magnets and a Hall element to achieve the required voltage output. For example: a magnet with a special designed shape generates a special magnetic field to allow the Hall element to move therein, so that the output voltage has a linear relationship with the angle change of the magnetic field. Another example is to form a digital position sensor by using multiple sets of bipolar NS magnets according to the Hall element. Still another example is to use two groups of NS magnets respectively having n pairs of magnetic poles and n+1 pairs of magnetic poles, in association with two groups of Hall elements so that the variation of the output voltage is detectable by the two groups of Hall elements.

Most Hall elements are used as movable members due to the magnet's special shape to provide a special magnetic field, which allows a linear relationship existing between the output voltage and the position of the Hall element.

Further, assuming that the Hall element is designed as a movable member, the signal line movement problem must be dealt with Therefore, in contrast to the fixed Hall element, the movable magnet ensures the reliability of the Hall element wiring.

However, according to the prior art, it is necessary to consider the stability of the magnet magnetization and the distance between the Hall element and the magnet. The closer the magnet is to the Hall element, the Hall element becomes more influenced by the distance of the magnet and thus the resulting voltage output is also influenced, which is because the Hall element is sensitive to the variation of the intensity of the magnetic field. So that the distance (X) between the magnet and the Hall element and the output voltage (V) of the Hall element have the linear relationship with smaller scope. The solution is to increase the configuration number of the magnet and the Hall element, which, however, also increases the volume of the whole device. Further, mounting error and the consistency of each magnet are the issues that must be considered in increasing the configuration number of the magnet and the Hall element. Because either one of the issues will cause the Hall element to output unexpected voltages.

In addition, when installing multiple Hall elements and magnets, the installation error factors and the magnetic flux density of the magnet must be considered, which will cause the voltage output not ideal.

SUMMARY OF THE INVENTION

The objective of the present invention is to provide a contactless volume control device with adjustable gain and multi-output, which is simple in structure and more durable than a contact structure, and has the capability of multiple and variable output characteristics to meet the needs of a variety of volume control.

In order to achieve the above purpose, the preferred embodiment of the present invention of the contactless volume control device includes a magnetic slider for generating a magnetic field; a rail formed to allow the magnetic slider to move therealong; a plurality of magnetic sensors configured along the rail for sensing the magnetic field to produce a plurality of sensed signals; and an output module for receiving and processing the plurality of sensed signals to produce at least one output signal.

The magnetic slider moves along the rail, so that the magnetic sensor senses the variation of the magnetic field of the magnetic slider and generates a plurality of sensed signals to the output module. A processing unit of the output module processes the plurality of sensed signals and generates an output signal. Then the output module transmits the output signal to an audio equipment for the volume controlling.

Because the at least one output signal is generated by a table list, which is pre-loaded into the processing unit for comparing the pre-loaded table list with the plurality of sensed signals, so the processing unit is able to load multiple tables at the same time to achieve the purpose of variable output and multi-output according to the output number of the processing unit.

Furthermore, the contactless volume control device with adjustable gain and multi-output provided by the present invention has the advantages of simple structure, low cost and the capability of rail length expansion and magnetic sensors increment.

BRIEF DESCRIPTION OF THE DRAWINGS

The invention, as well as its many advantages, may be further understood by the following detailed description and drawings in which.

DETAILED DESCRIPTION OF THE INVENTION

Figure 1:
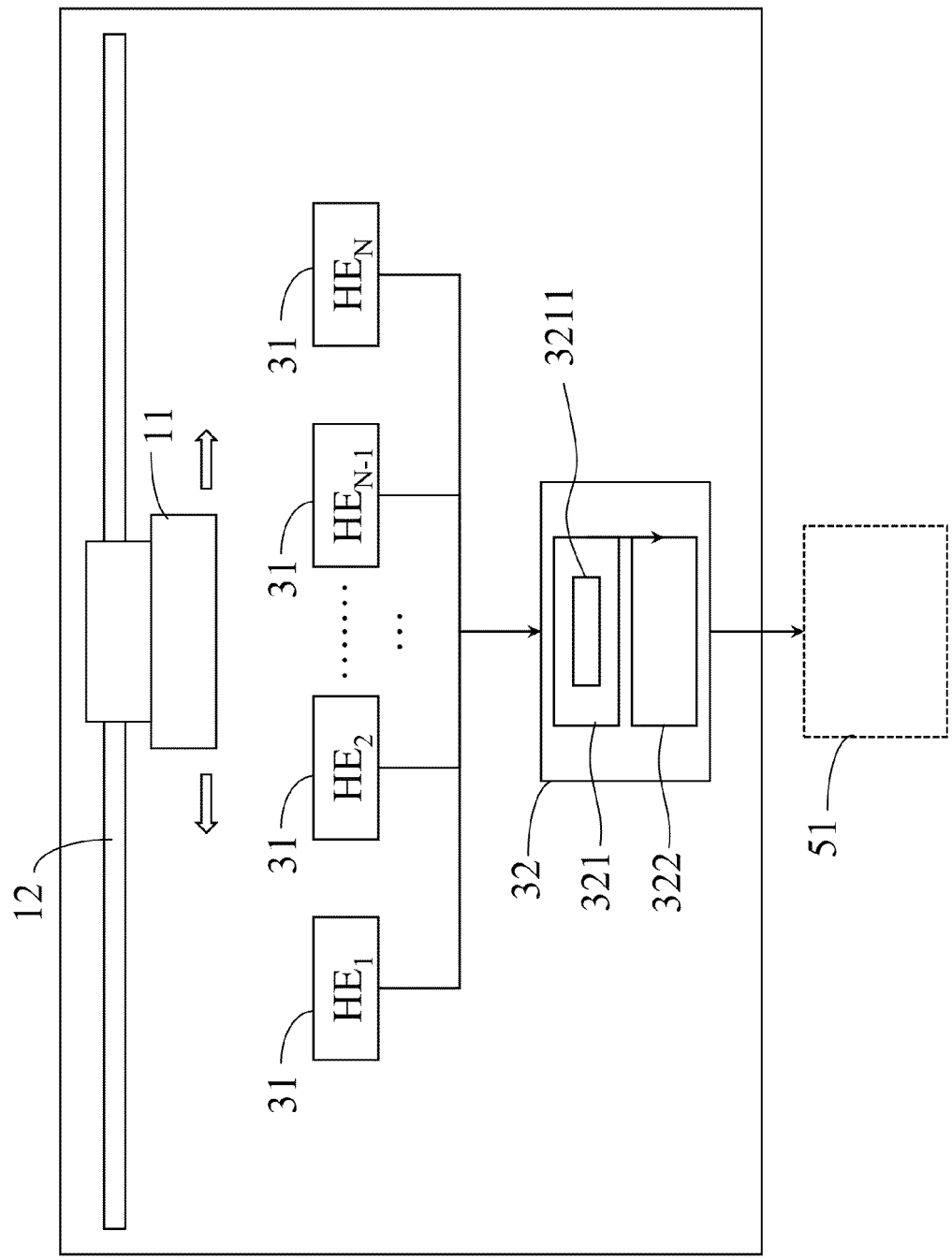
FIG. 1 is a block diagram showing the contactless volume control device with adjustable gain and multi-output of the present invention.

With reference to FIG. 1, a contactless volume control device with adjustable gain and multi-output of the present invention includes: a magnetic slider 11, a rail 12, a plurality of magnetic sensor 31 and an output module 32.

The magnetic slider 11 is an object with magnetic properties and has a magnetic field therearound. The polarity of the magnetic field has no fixed direction and amount. No matter it is a monopole (N or S), a bipolar (NS) or a quadru-pole, is all acceptable.

The rail 12 has a track combined with the magnetic slider 11 allowing the magnetic slider 11 to move thereon.

The magnetic sensor module 31 is provided along the track of the rail 12 and is kept at a predetermined distance to the magnetic slider 11 (as shown in FIG. 1, it is assumed that there are N groups of magnetic sensor modules 31), and the magnetic sensor modules 31 sense the magnetic field around the magnetic slider 11 and then produce a plurality of sensing signals.

The output module 32 is electrically connected to the magnetic sensor module 31 and receives the plurality of sensing signals for signal processing, so as to produce at least one output signal to an audio device 51.

The magnetic sensor module 31 is a Hall element (HE). The output module 32 includes a processing unit 321 (such as Microcontroller Unit ' MCU) and a filtering unit 322.

The sensing signals are recorded in at least one data table, which is loaded and stored in the memory storage 3211 of the processing unit 321. The data table displays as a matrix. The element of the matrix includes the sensing signal, the at least one output signal so as to acquire the position of the magnetic slider 11 and the at least one output signal.

In this embodiment, in order to output a DC signal from the output module 32, the sensing signal is processed by the processing unit 321 via a pulse width modulation (PWM), and then the sensing signal is processed by the filter unit 322 via a low pass filtering process, so that the sensing signal is converted as a DC signal output by the output module 32.

When the magnetic slider 11 moves along the rail 12 for a distance, the magnetic field around the magnetic slider 11 is sensed by the magnetic sensor module 31 close to the magnetic slider 11. When the magnetic sensor module 31 senses the magnetic field, the magnetic sensor module 31 will generate the sensing signal to the output module 32. The output module 32 then compares the sensing signal with the data table stored in the output module 32 and then produces at least one output signal to control the volume regulation.

From the above description, in order to achieve the operation of the preferred embodiment, first of all, a matrix table C is established as follows:

$$C = \begin{bmatrix} v_{1,1} & v_{2,1} & v_{3,1} & \ldots & v_{N,1} & V_{1,1} & V_{2,1} \\ \ldots & \ldots & \ldots & \ldots & \ldots & \ldots & \ldots \\ v_{1,M} & v_{2,M} & v_{3,M} & \ldots & v_{N,M} & V_{1,M} & V_{2,M} \end{bmatrix}$$

Figure 2:
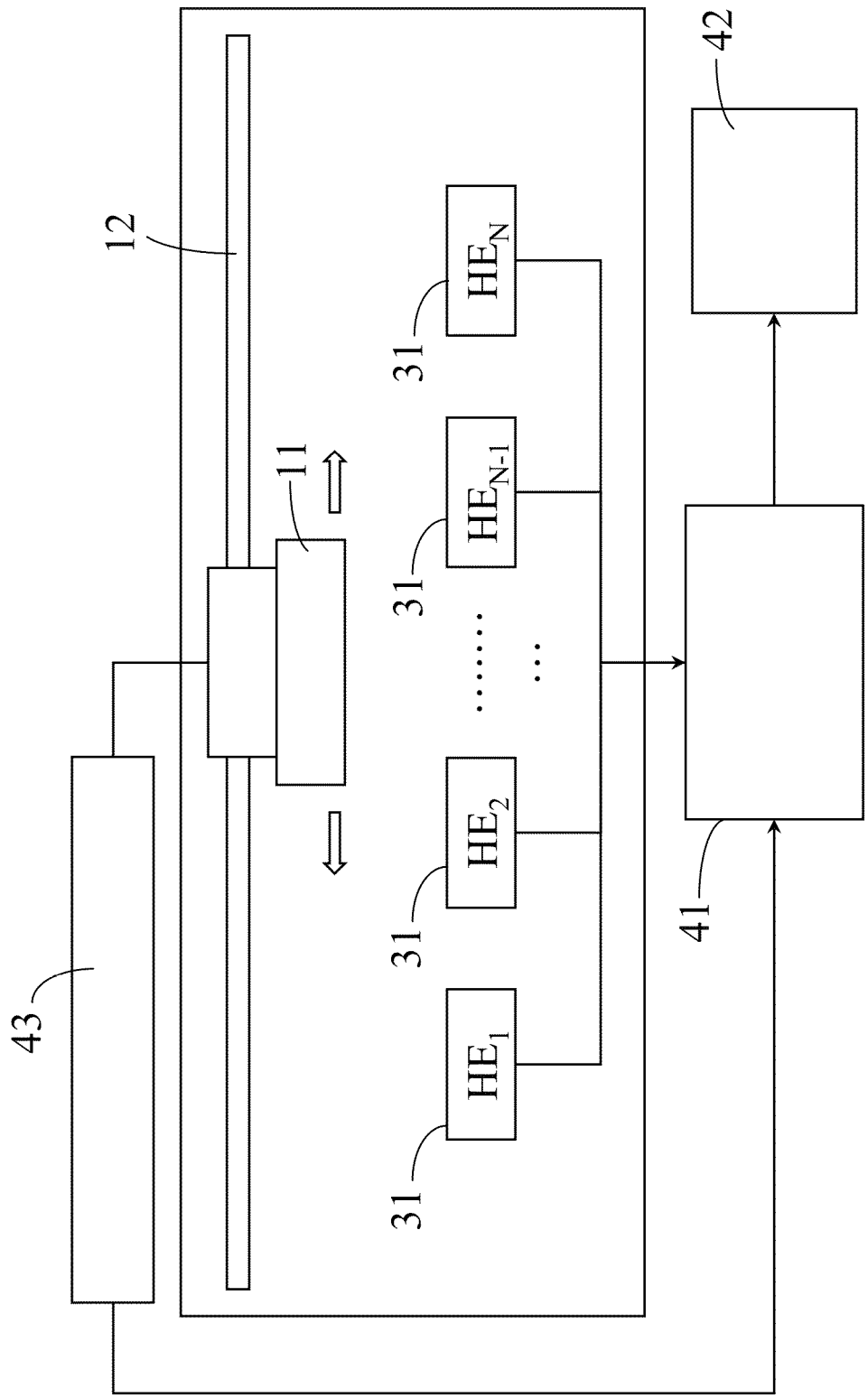
FIG. 2 is a verification block diagram showing the contactless volume control device with adjustable gain and multi-output of the present invention.

With reference to FIG. 2, which is a verification device for establishing the matrix data table C, the verification device includes a magnetic slider 11 a rail 12, magnetic sensor modules 31, the data acquisition module 41, a computer 42 and a potentiometer module 43 (potentiometer), wherein the configuration of the magnetic slider 11, the rail 12 and the magnetic sensor modules 31 should be the same structure as FIG. 1. The potentiometer module 43 is electrically connected to the magnetic slider 11 and the data acquisition module 41 respectively.

Wherein the potentiometer module 43 is a position sensor used for sensing the magnetic slider 11, and generates a potentiometer signal ($V_{POT}$) according to the magnetic sliding 11 at any position of the rail 12, and the potentiometer signal ($V_{POT}$) is captured by the acquisition module 41.

It is assumed that the magnetic sensor 31 has totally N groups, therefore, the magnetic sensor 31 can be used to sense the magnetic slider 11 at any point of the rail 12, and generate N groups of sensing signals v1, v2, v3 ... vN, which can be captured by the acquisition module 41. At the same time, the acquisition module 41 captures the signals Vpot, v1, v2, v3 ... vN of the magnetic sensor module 31 and the potentiometer module 43, and creates a set of (N+1)×M matrix data table A[x, V1, V2, v3, ... VN] via the computer 42 as shown in the following:

$$A = \begin{bmatrix} X_1 & V_{1,1} & V_{2,1} & V_{3,1} & \ldots & V_{N,1} \\ \ldots & \ldots & \ldots & \ldots & \ldots & \ldots \\ X_M & V_{1,M} & V_{2,M} & V_{3,M} & \ldots & V_{N,M} \end{bmatrix}$$

The M in the matrix data table A represents the capturing times of the acquisition module 41 and the X in the matrix data table A represents the position the magnetic slider 11 located on the rail 12. The $V_1 \sim V_N$ in the matrix data table A are the voltages generated by that N groups of magnetic sensor module 31 senses the magnetic field.

Figure 3:
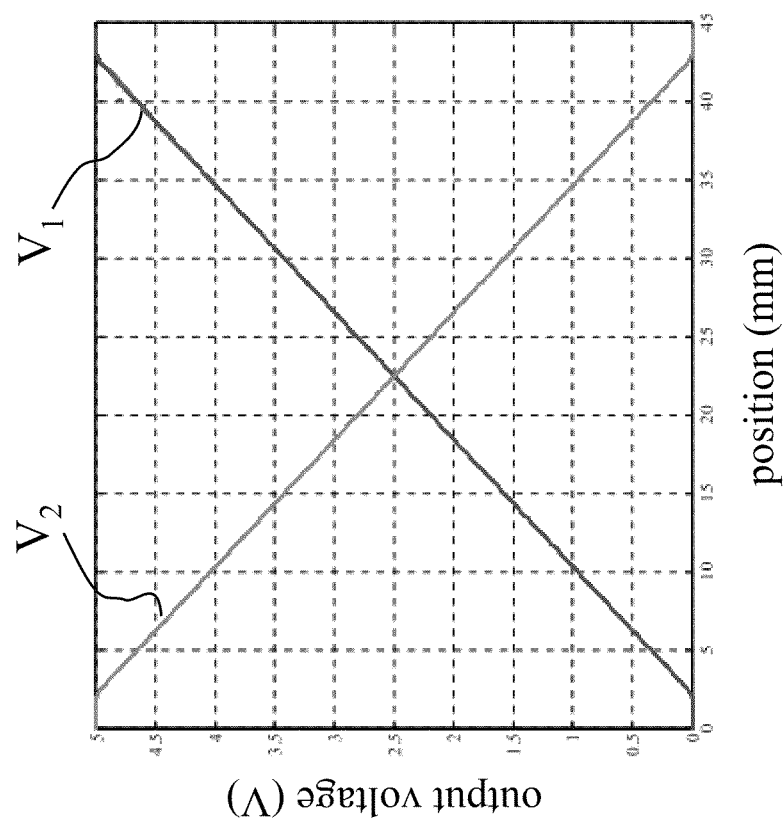
FIG. 3 is a diagram showing the dual-output volume control position vs. output voltage relationship for the preferred embodiment of the present invention.

Next, the preferred embodiment for the part of the adjustable gain uses location vs. output voltage relationship as shown in FIG. 3, which shows the relationship between a dual output volume control position and output voltage, and the dual output characteristic of FIG. 3 is converted into a 3×M matrix data table B [X, V1, V2], as shown in the following:

$$B = \begin{bmatrix} x_1 & V_{1,1} & V_{2,1} \\ \ldots & \ldots & \ldots \\ x_M & V_{1,M} & V_{2,M} \end{bmatrix}$$

wherein x represents the position the magnetic slider 11 located on the rail 12, V1 and V2 are the outputs of the volume control device. The above mentioned matrix data tables A and B are combined and converted as the above mentioned matrix data table C ([$X_M$] of the matrix data table A can be replaced by [$V_{1,M}, V_{2,M}$] in matrix data table B, and [$X_M$] of the matrix data table B can be replaced by [$V_{1,M}, V_{2,M}, V_{3,M} \ldots V_{N,M}$] in matrix data table A), which is a group of (N+2)×M matrix data table C[$V_{1,M}, V_{2,M}, V_{3,M} \ldots V_{N,M}, V_{1,1}, V_{2,1}$] as shown in the following:

$$C = \begin{bmatrix} v_{1,1} & v_{2,1} & v_{3,1} & \ldots & v_{N,1} & V_{1,1} & V_{2,1} \\ \ldots & \ldots & \ldots & \ldots & \ldots & \ldots & \ldots \\ v_{1,M} & v_{2,M} & v_{3,M} & \ldots & v_{N,M} & V_{1,M} & V_{2,M} \end{bmatrix}$$

The matrix data table C along with a program code can be loaded into the memory storage 3211 of the processing unit 321 for the operation of the output module 32.

With reference to FIG. 1 and the matrix data table C, when the magnetic slider 11 is sensed by the magnetic sensor module 31, then the magnetic sensor module 31 generates the sensing signal as [$v_1, v_2, v_3 \ldots v_N$], which is received by the output module 32. The processing unit 321 of the output module 32 compares the sensing signals [$v_1, v_2, v_3 \ldots v_N$] with the matrix data table C. If the sensing signals [$v_1, v_2, v_3 \ldots v_N$] matches to the values in a row of the matrix data table C, the output module 32 will output the $v_1, v_2$ corresponding to the values in the row, so that the FIG. 3 can be acquired.

Furthermore, beside the matrix data table C, the processing unit 321 can additionally load a matrix data table with different characteristics at the same time, so that the output module 32 has different output characteristics for switching selection, and the output module 32 is not limited to only two sets of V1 and V2 outputs, which is only limited by the output number of the processing unit 321, so as to reach the multiple output volume control with adjustable gain.

Further, the contactless volume control device with adjustable gain and multi-output provided by the present invention can increase the number of the magnetic sensor module 31 and the length of the slider 11 according to demands. If the quantity of the magnetic sensor module 31 number exceeds the output number corresponding to the processing unit 321, then an analog-digital conversion module (ADC) module 44 is added between the magnetic sensor module 31 and the processing unit 321, such as the structure shown in FIG. 4.

The analog-digital conversion module 44 converts the sensing signal generated by the magnetic sensor module 31 into a plurality of digital signal, and then the chip selector (CS, not shown) of the processing unit 321 chooses to receive these digital signals, so that the output signal generated by the output module 32 is digitized to conduct a follow-up operation.

Figure 4:
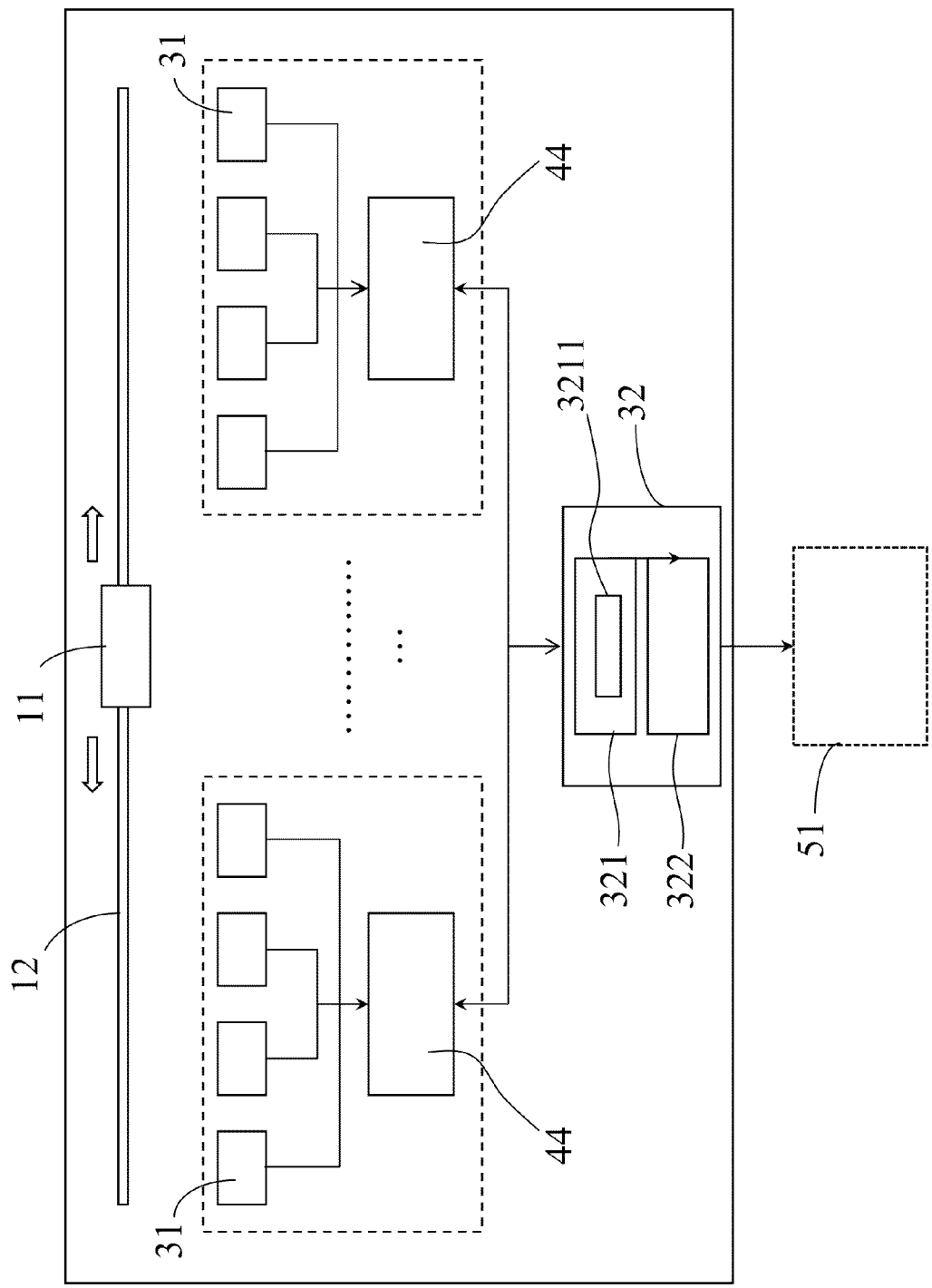
FIG. 4 is a partial scan block diagram showing the contactless volume control device with adjustable gain and multi-output of the present invention.

However, a partial scan can be carried out in the architecture shown in FIG. 4, the processing unit 321 automatically scans the analog-digital conversion module 44 to identify the starting position of the magnetic slider 11 when the contactless volume control device with adjustable gain and multi-output is activated, which allows the output module 32 to scan the magnetic sensor module 31 near the location of the magnetic slider 11, and without scanning the magnetic sensor module 31 far from the magnetic slider 11 via the processing unit 321, so as to reduce the computational burden of the processing unit 321.

It is to be noted that the contactless volume control device with adjustable gain and multi-output provided by the present invention replaces the contact structure of conventional conductive carbon film with the magnetic slider 11 and the magnetic sensor module 31 to increase the service life, and the sources of the processing unit 321 and the magnetic sensor module 31 are extended, which reduces the manufacturing cost. Further, the matrix data table built by the position with different characteristics-voltage output type is loaded into the memory storage 3211 of the processing unit 321 to allow the output module 32 to generate different output characteristics, so that the purpose of the adjustable gain is reached. Also the number of output terminal of the processing unit can make the purpose of multi-output signals be achieved. At the same time, the magnetic sensor module 31 has the capability of length expansion so as to meet different application.

Many changes and modifications in the above described embodiment of the invention can, of course, be carried out without departing from the scope thereof. Accordingly, to promote the progress in science and the useful arts, the invention is disclosed and is intended to be limited only by the scope of the appended claims.

What is claimed is:

1. A contactless volume control device with adjustable gain and multi-output, comprising:
    a magnetic slider for generating a magnetic field;
    a rail defined to allow the magnetic slider to move therealong;
    a plurality of magnetic sensor modules provided along the rail for sensing the magnetic field to produce a plurality of signals; and
    an output module including a processing unit and a filter unit, wherein the output module is used to receive and process the plurality of signals to produce at least one output signal to an audio device,
    wherein the processing unit loads in multiple matrix data tables at the same time for signal processing, to achieve variable output and multi-output according to an output number of the processing unit, and
    a number of the plurality of magnetic sensor modules and length of the slider are varied according to demands.

2. The contactless volume control device with adjustable gain and multi-output as claimed in claim 1, wherein the plurality of magnetic sensor modules are Hall elements.

3. The contactless volume control device with adjustable gain and multi-output as claimed in claim 1, wherein the processing unit loads in at least one set of matrix data table for signal processing.

4. The contactless volume control device with adjustable gain and multi-output as claimed in claim 3, wherein the signal processing is comparing the plurality of signals to the matrix data tables so as to produce the at least one output signal.

* * * * *